United States Patent

(12) United States Patent
Chen et al.

(10) Patent No.: US 10,734,283 B2
(45) Date of Patent: Aug. 4, 2020

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Hui-Chi Chen, Hsinchu County (TW); Hsiang-Ku Shen, Hsinchu (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 184 days.

(21) Appl. No.: 16/049,305

(22) Filed: Jul. 30, 2018

(65) Prior Publication Data
US 2018/0337092 A1 Nov. 22, 2018

Related U.S. Application Data

(62) Division of application No. 15/180,907, filed on Jun. 13, 2016, now Pat. No. 10,163,704.
(Continued)

(51) Int. Cl.
H01L 29/78 (2006.01)
H01L 21/768 (2006.01)
H01L 29/66 (2006.01)

(52) U.S. Cl.
CPC .. *H01L 21/76897* (2013.01); *H01L 21/76829* (2013.01); *H01L 21/76883* (2013.01); *H01L 29/6656* (2013.01); *H01L 29/78* (2013.01)

(58) Field of Classification Search
CPC ............ H01L 29/518; H01L 21/02186; H01L 21/02164; H01L 21/02126; H01L 21/0217;
(Continued)

(56) References Cited

U.S. PATENT DOCUMENTS 7,667,271 B2 2/2010 Yu et al.
7,910,453 B2 3/2011 Xu et al.
(Continued)

FOREIGN PATENT DOCUMENTS

TW 201340295 A 10/2013

OTHER PUBLICATIONS

Office Action dated Jul. 6, 2017, issued in Taiwanese Patent Application No. 10620699400 (5 pages).
(Continued)

*Primary Examiner* — Steven H Loke
*Assistant Examiner* — Samuel Park
(74) *Attorney, Agent, or Firm* — McDermott Will & Emery LLP

(57) ABSTRACT

A semiconductor device includes a first gate structure disposed on a substrate and extending in a first direction. The first gate structure includes a first gate electrode, a first cap insulating layer disposed over the first gate electrode, first sidewall spacers disposed on opposing side faces of the first gate electrode and the first cap insulating layer and second sidewall spacers disposed over the first sidewall spacers. The semiconductor device further includes a first protective layer formed over the first cap insulating layer, the first sidewall spacers and the second sidewall spacers. The first protective layer has a π-shape having a head portion and two leg portions in a cross section along a second direction perpendicular to the first direction.

20 Claims, 7 Drawing Sheets

Related U.S. Application Data

(60) Provisional application No. 62/272,300, filed on Dec. 29, 2015.

(58) Field of Classification Search
CPC ........... H01L 21/02178; H01L 29/6656; H01L 21/02189; H01L 29/6653; H01L 21/02167; H01L 21/76883; H01L 21/76897; H01L 29/78; H01L 29/665; H01L 29/4966; H01L 29/785
See application file for complete search history.

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,209,273 B1 | 12/2015 | Lin et al. |
| 2008/0087966 A1 | 4/2008 | Tai et al. |
| 2012/0091469 A1 | 4/2012 | Park et al. |
| 2012/0139062 A1* | 6/2012 | Yuan ................ H01L 21/76897 257/411 |
| 2013/0030414 A1 | 1/2013 | Gardner et al. |
| 2013/0200393 A1 | 8/2013 | Chen et al. |
| 2013/0248950 A1 | 9/2013 | Kang et al. |
| 2013/0299922 A1* | 11/2013 | Choi et al. .......... H01L 29/4966 438/586 |
| 2013/0309856 A1 | 11/2013 | Jagannathan et al. |
| 2013/0328112 A1 | 12/2013 | Xie et al. |
| 2014/0001574 A1 | 1/2014 | Chen et al. |
| 2014/0110755 A1 | 4/2014 | Colinge |
| 2014/0124841 A1 | 5/2014 | Xie et al. |
| 2014/0151812 A1 | 6/2014 | Liaw |
| 2014/0154877 A1* | 6/2014 | Besser ................ H01L 29/4966 438/586 |
| 2014/0203348 A1 | 7/2014 | Suk et al. |
| 2015/0206844 A1 | 7/2015 | Pham et al. |
| 2015/0214367 A1* | 7/2015 | Chang ............... H01L 21/76897 257/401 |
| 2015/0263160 A1 | 9/2015 | Xie et al. |
| 2016/0148846 A1 | 5/2016 | Ok et al. |
| 2016/0293725 A1* | 10/2016 | Liou ................. H01L 29/66545 |
| 2016/0308004 A1 | 10/2016 | Lee et al. |
| 2016/0315045 A1 | 10/2016 | Baek et al. |
| 2016/0372567 A1 | 12/2016 | Tak et al. |
| 2017/0117380 A1* | 4/2017 | Lu ....................... H01L 29/6656 |

OTHER PUBLICATIONS

Office Action dated Nov. 8, 2017, issued in corresponding Korean Application No. 10-2016-0137608 (4 pages).

Final Office Action dated Nov. 30, 2017 issued in U.S. Appl. No. 15/180,907 (27 pages).

Non-Final Office Acion dated May 4, 2017 issued in U.S. Appl. No. 15/180,907 (32 pages).

Non-Final Office Action dated Feb. 16, 2017 issued in U.S. Appl. No. 15/180,907 (7 pages).

* cited by examiner

SEMICONDUCTOR DEVICE AND A METHOD FOR FABRICATING THE SAME

CROSS-REFERENCE TO RELATED APPLICATIONS

This application is continuation of U.S. application Ser. No. 15/180,907 filed on Jun. 13, 2016, which claims priority to U.S. Provisional Patent Application No. 62/272,300 filed Dec. 29, 2015, the entire disclosures of which are incorporated herein by reference.

TECHNICAL FIELD

The disclosure relates to a method for manufacturing a semiconductor device, and more particularly to a structure and a manufacturing method for a self-align contact structure over source/drain regions.

BACKGROUND

With a decrease of dimensions of semiconductor devices, a self-aligned contact (SAC) has been widely utilized for fabricating, e.g., source/drain (S/D) contacts arranged closer to gate structures in a field effect transistor (FET). Typically, a SAC is fabricated by patterning an interlayer dielectric (ILD) layer, under which a contact etch-stop layer (CESL) is formed over the gate structure having sidewall spacers. The initial etching of the ILD layer stops at the CESL, and then the CESL is etched to form the SAC. As the device density increases (i.e., the dimensions of semiconductor device decreases), the thickness of the sidewall spacer becomes thinner, which may cause a short circuit between the S/D contact and the gate electrodes. Accordingly, it has been required to provide SAC structures and manufacturing process with improved electrical isolation between the S/D contacts and gate electrodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
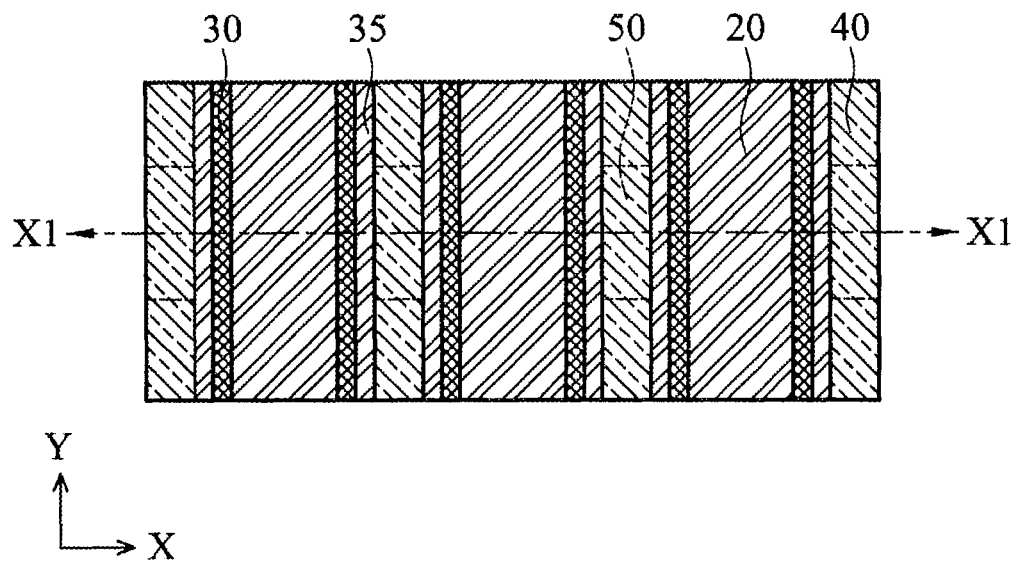
FIG. 1A shows an exemplary plan view (viewed from the above) illustrating one stage of a sequential fabrication process of a semiconductor device according to one embodiment of the present disclosure.
Figure 1B:
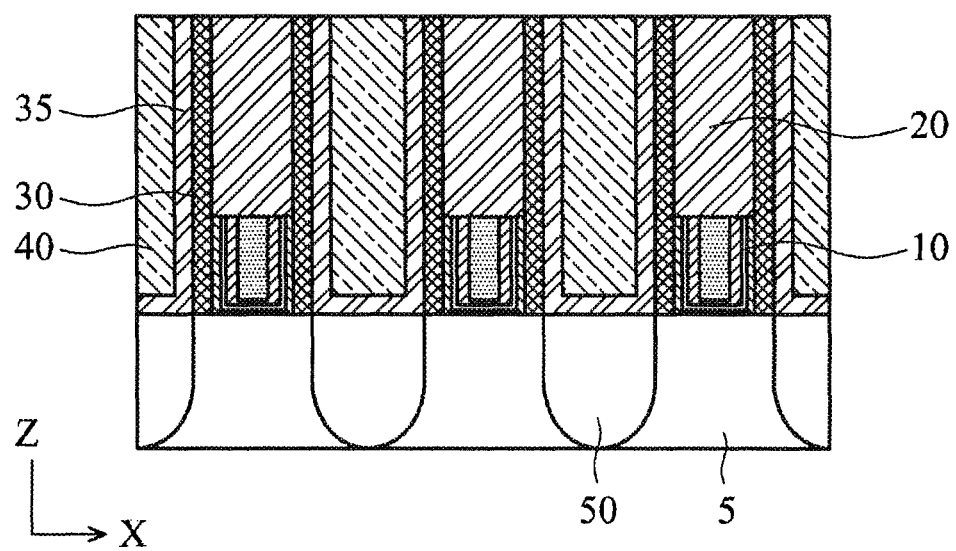
FIG. 1B shows an exemplary cross sectional view along line X1-X1 of FIG. 1A.

FIGS. 1A and 1B show one stage of a sequential fabrication process of a semiconductor device according to one embodiment of the present disclosure. FIG. 1A shows a plan (top) view and FIG. 1B shows a cross sectional view along line X1-X1 of FIG. 1A.

FIGS. 1A and 1B show a structure of a semiconductor device after metal gate structures are formed. In FIGS. 1A and 1B, metal gate structures 10 are formed over a channel layer 5, for example, a part of a fin structure, and cap insulating layers 20 are disposed over the metal gate structures 10 in the Z direction The metal gate structures 10 extend in the Y direction and are arranged in the X direction. The thickness of the metal gate structures 10 is in a range from about 15 nm to about 50 nm in some embodiments. The thickness of the cap insulating layer 20 is in a range from about 10 nm to about 30 nm in some embodiments, and is in a range from about 15 nm to about 20 nm in other embodiments. Sidewall spacers 30, which may be referred to as a first sidewall, are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 8 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with a first interlayer dielectric (ILD) layer 40. In addition, a contact etch-stop layer (CESL) 35, which may also be referred to as a second sidewall, is formed on the sidewall spacers 30 as shown in FIGS. 1A and 1B. The film thickness of the CESL 35 is in a range from about 3 nm to about 15 nm in some embodiments, and is in a range from about 4 nm to about 8 nm in other embodiments.

Figure 1C:
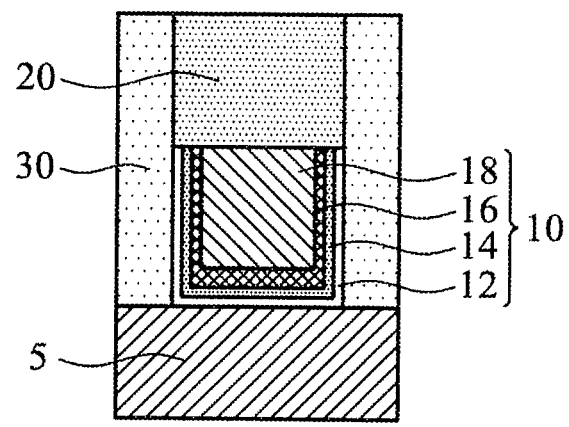
FIG. 1C is an enlarged view of the gate structure shown in FIG. 1B.

FIG. 1C is an enlarged view of the gate structure. The metal gate structure 10 includes one or more layers 18 of metal material, such as Al, Cu, W, Ti, Ta, TiN, TiAl, TiAlC, TiAlN, TaN, NiSi, CoSi, and other conductive materials. A gate dielectric layer 14 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interface dielectric layer 12 made of, for example silicon dioxide, is formed between the channel layer 5 and the gate dielectric layer 14.

In some embodiments, one or more work function adjustment layers 16 are interposed between the gate dielectric layer 14 and the metal material 18. The work function adjustment layers 16 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more layers of insulating material such as silicon oxide based material including SiOC and SiOCN or a low-k dielectric material having a dielectric constant of about 3 to about 4. In some embodiments, the CESL 35 is made of a different material than the cap insulating layer 20 and includes one or more layers of insulating material, such as silicon nitride based material including SiN, SiCN and SiOCN. In some embodiments, the CESL 35 is made of the same material as the cap insulating layer 20. The first ILD layer 40 includes one or more layers of insulating material including a silicon oxide based material, such as silicon dioxide ($SiO_2$) and SiON.

The material of the sidewall spacer 30 and the CESL 35, the material of the cap insulating layer 20, and a material of the first ILD layer 40 are different from each other in certain embodiments, so that each of these layers can be selectively etched. In one embodiment, the sidewall spacer 30 is made of SiOC or SiOCN, the cap insulating layer 20 and the CESL 35 are made of SiN, and the first ILD 40 layer is made of $SiO_2$.

In this embodiment, fin field effect transistors (Fin FETs) fabricated by a gate-replacement process are employed.

Figure 1D:
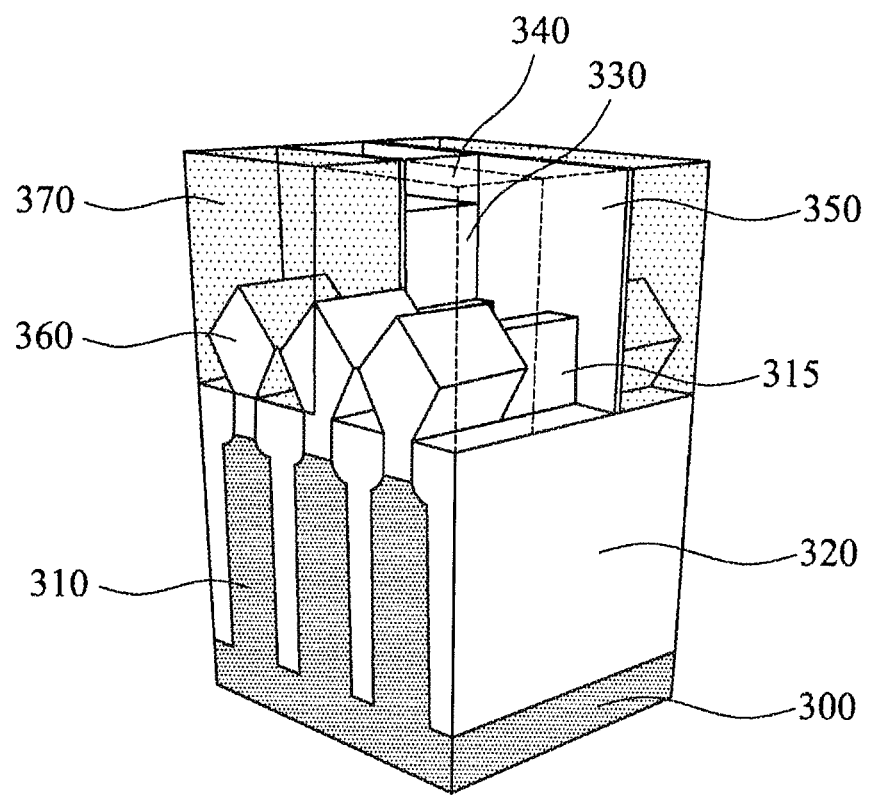
FIG. 1D shows an exemplary perspective view illustrating one stage of a sequential fabrication process of a semiconductor device according to one embodiment of the present disclosure.

FIG. 1D shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region 360. After a planarization operation, the dummy gate structure is removed so as to make a gate space. Then, in the gate space, a metal gate structure 330 including a metal gate electrode and a gate dielectric layer, such as a high-k dielectric layer, is formed. Further, a cap insulating layer 340 is formed over the metal gate structure 330. In addition, a CESL (not shown in FIG. 1D) is formed on the sidewalls 330. In FIG. 1D, the view of parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 1D substantially correspond to the metal gate structures 10, cap insulating layers 20, sidewall spacers 30, source/drain regions 50 and first interlayer dielectric layer (ILD) 40, of FIGS. 1A and 1B, respectively.

FIGS. 2-10 show exemplary cross sectional views corresponding to line X1-X1 of FIG. 1A, illustrating various stages of the sequential fabrication process of a semiconductor device according to one embodiment of the present disclosure. It is understood that additional operations can be provided before, during, and after processes shown by FIGS. 2-10, and some of the operations described below can be replaced or eliminated, for additional embodiments of the method. The order of the operations/processes may be interchangeable.

Figure 2:
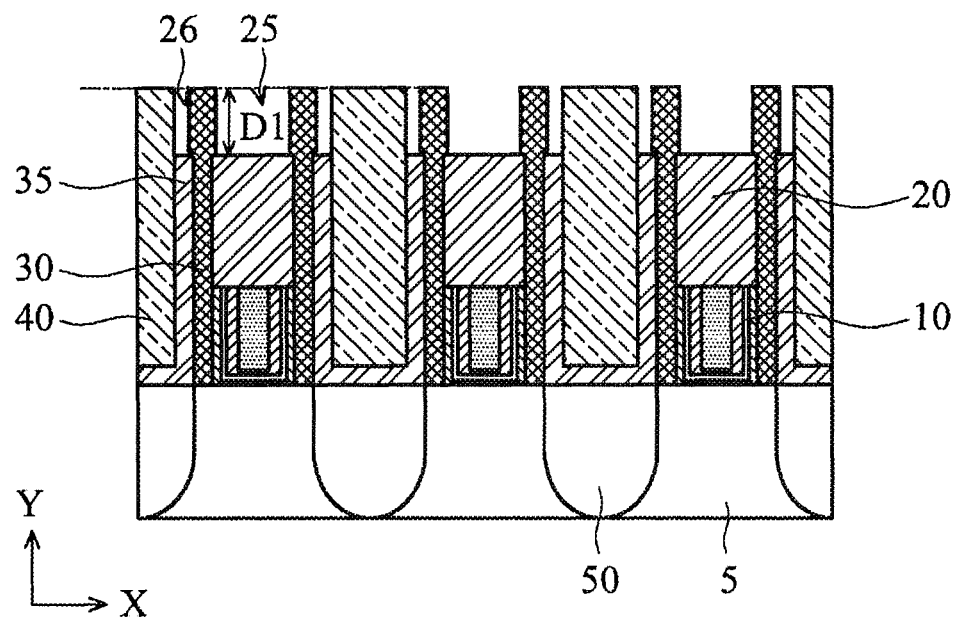
FIGS. 2-10 show exemplary cross sectional views corresponding to line X1-X1 of FIG. 1A illustrating various stages of the sequential fabrication process of a semiconductor device according to one embodiment of the present disclosure.

As shown in FIG. 2, the cap insulating layer 20 and the CESL 35 are recessed by using a dry and/or a wet etching process. Since the cap insulating layer 20 and the CESL 35 are made of the same material and made of a material different from the sidewall spacers 30 and the first ILD layer 40, the cap insulating layer 20 and the CESL 35 can be substantially selectively etched. The depth D1 of the recessed space 25 over the recessed cap insulating layer 20 measured from the upper surface of the first ILD layer 40 is in a range from about 10 nm to about 30 nm in some embodiments, and is in a range from about 15 nm to about 25 nm in other embodiments. The depth of the recessed space 26 over the recessed CESL 35 is substantially the same as the depth D1 (the difference is less than about 1 nm). However, the depth of the recessed space 26 may be smaller or larger than the depth D1 (the difference is not less than about 1 nm).

Figure 3:
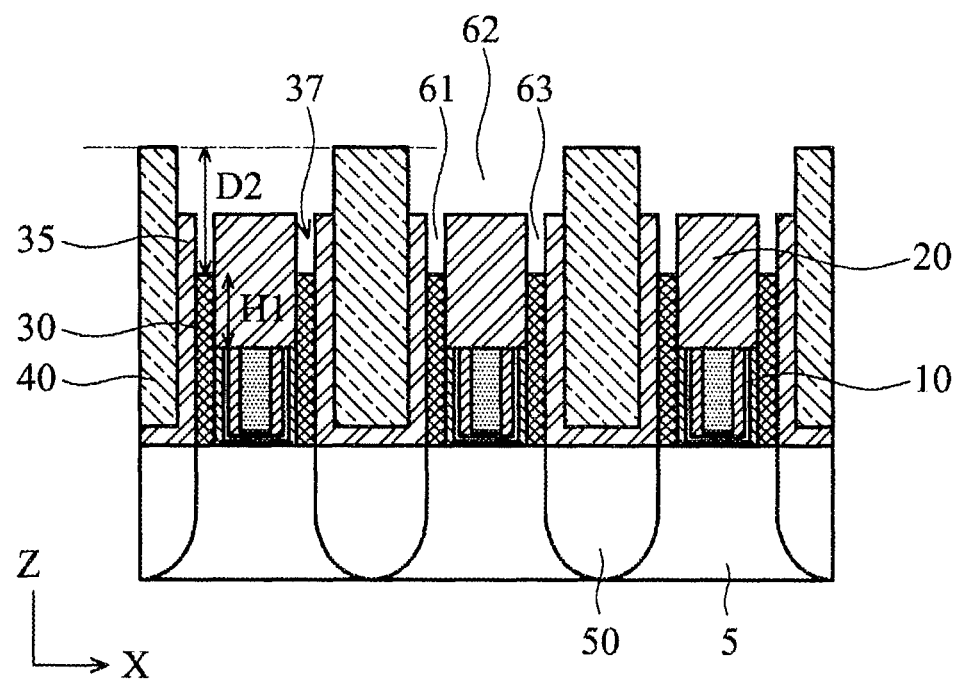

As shown in FIG. 3, the sidewall spacers 30 are recessed by using a dry and/or a wet etching process, thereby forming a recessed space 37. Since the sidewall spacers 30 are made of a material different from the cap insulating layer 20, the CESL 35 and the first ILD layer 40, the sidewall spacer layers 30 can be substantially selectively etched. As shown in FIG. 3, the recess has a π-shape having a head portion 62 and two leg portions 61, 63 in a cross section along the X direction. The depth D2 of the recessed space 37 measured from the upper surface of the first ILD layer 40 is at least about 5 nm more than D1 and in a range from about 20 nm to about 50 nm in some embodiments, and is in a range from about 10 nm to about 30 nm in other embodiments. The height H1 of the bottom of the recessed space 37 measured from the upper surface of the gate structure 10 (e.g., the metal gate 18) is in a range from about 5 nm to about 30 nm in some embodiments.

As shown in FIG. 3, the depth D2 is greater than the depth D1, and the difference is more than about 3 nm. It is noted that the cap insulating layer 20 and the CESL 35 may be recessed after the sidewall spacers 30 are recessed.

Figure 4:
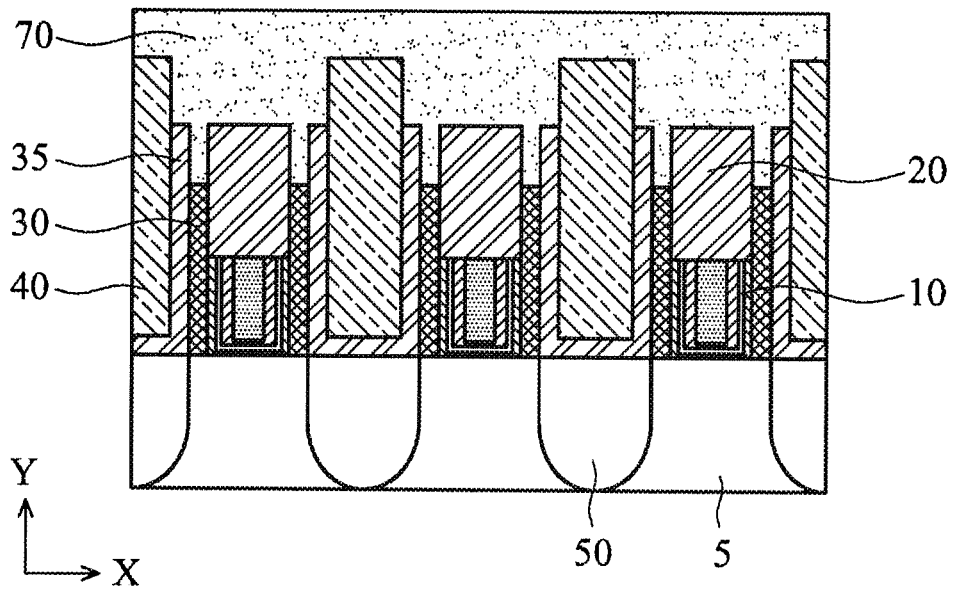

A protective layer is subsequently formed in the recessed spaces 25, 26 and 37. As shown in FIG. 4, one or more blanket layers of an insulating material 71 are formed over the structure shown in FIG. 3, and a planarization operation, such as an etch-back process and/or a chemical mechanical polishing (CMP) process, is performed, thereby obtaining the structure of FIG. 5. The insulating material 71 may be formed by CVD, physical vapor deposition (PVD) including sputtering, atomic layer deposition (ALD), or other suitable film forming methods. After the planarization operation, the thickness H2 of the protective layer 70 measured from the upper surface of the cap insulating layer 20 is in a range from about 5 nm to about 20 nm in some embodiments, and is in a range from about 7 nm to about 15 nm in other embodiments.

The protective layer 70 is made of a material which has a high etching resistivity against a silicon oxide based material. In some embodiments, at least one of aluminum nitride, aluminum oxynitride, aluminum oxide, titanium oxide, zirconium oxide is used as the protective layer 70.

Figure 5:
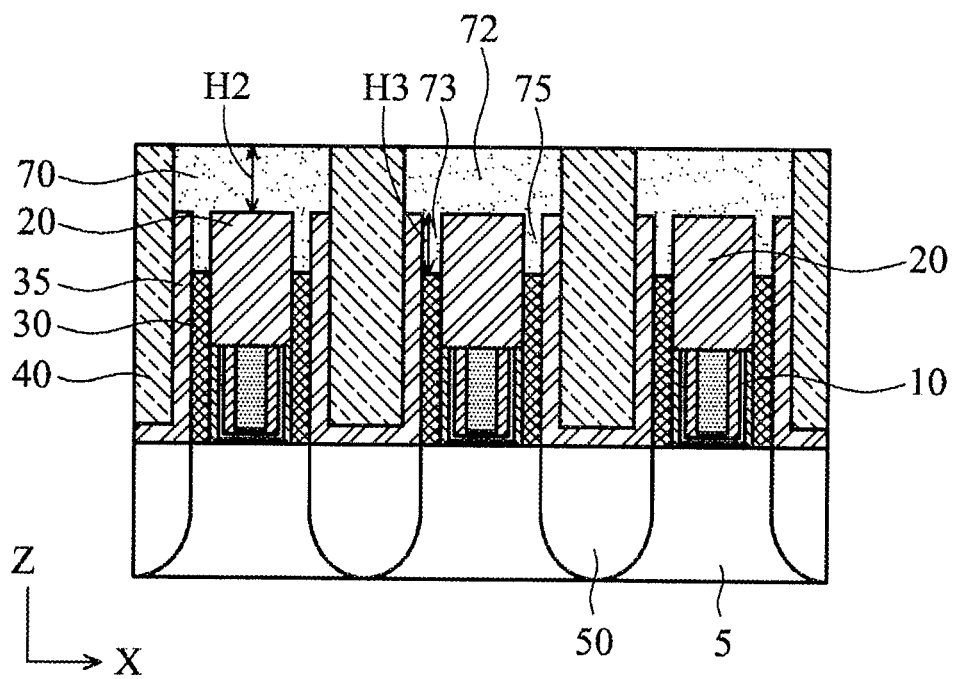

As shown in FIG. 5, the protective layer 70 has am-shape having a head portion 72 and two leg portions 73, 75 in a cross section along the X direction. The length H3 of the leg portions is in a range from about 5 nm to about 10 nm in some embodiments.

Figure 6:
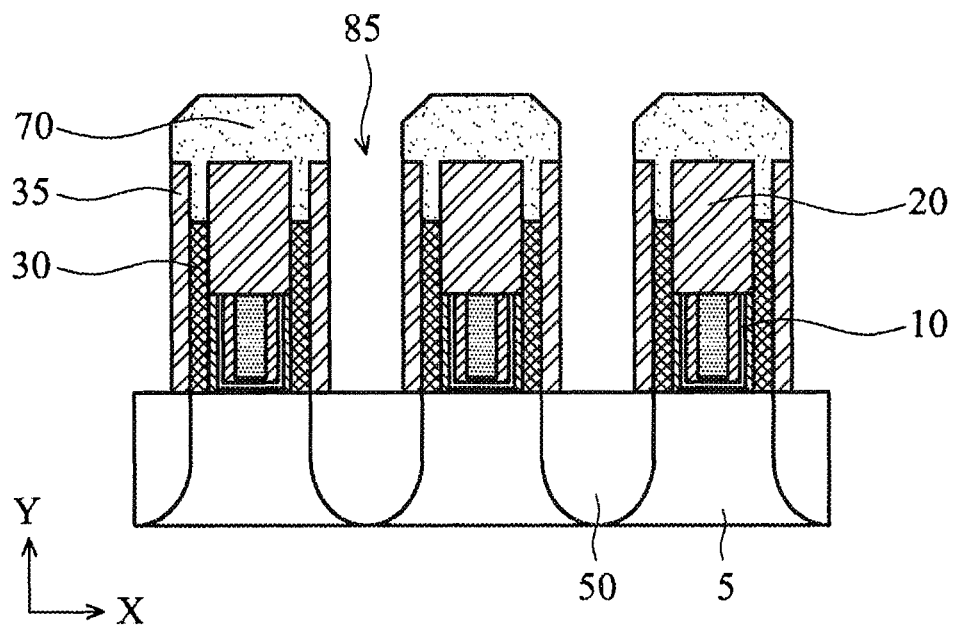

After the protective layer 70 is formed, the first ILD layer 40 over the source/drain region 50 is removed by using suitable lithography and etching operations, as shown in FIG. 6, thereby forming contact openings 85 so as to expose at least one source/drain region 50.

In some embodiments, the first ILD is entirely removed and then a second ILD is formed over the gate structures. Then, the contact opening 85 is formed by using a lithography operation and an etching operation, so at to expose at least one source/drain region 50, as shown in FIG. 6.

As shown in FIG. 6, during the contact opening etching, a part of the protective layer 70 is also etched. However, since the protective layer 70 has a higher etching resistivity than the CESL 35 during the contact hole etching, which is an oxide etching, the amount of the etched portion of the CESL 35 can be minimized. Moreover, due to the protective layer 70, the cap insulating layer 20 and the sidewall spacers 30 are not etched during the contact opening etching. Thus, the upper ends of the cap insulating layer 20 maintain the substantially right angle corners. Since the cap insulating layer 20 is protected from being etched, a short circuit between the metal gate 10 and the source/drain contact 95 (see FIGS. 8 and 9) can be avoided.

Figure 7:
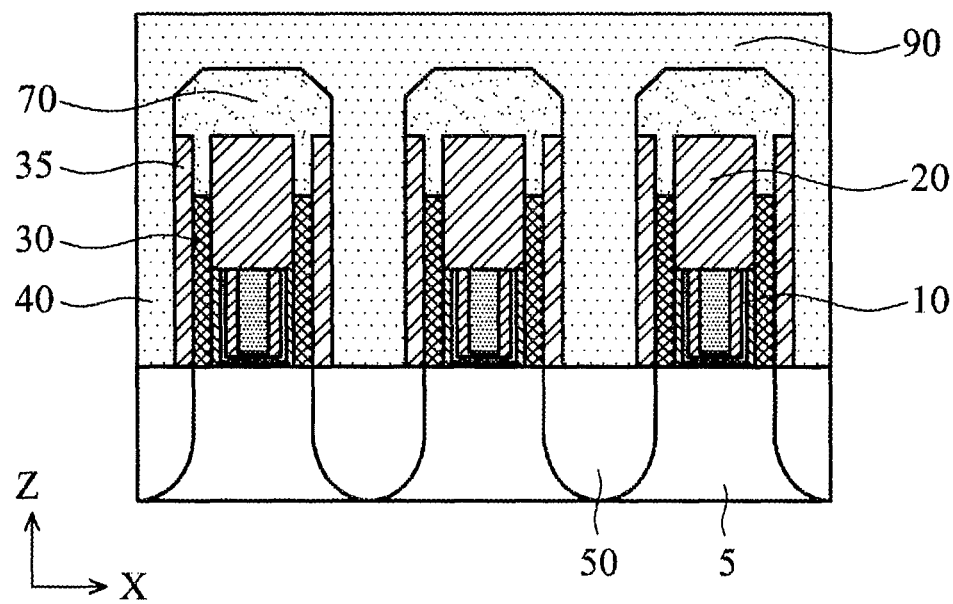
Figure 8:
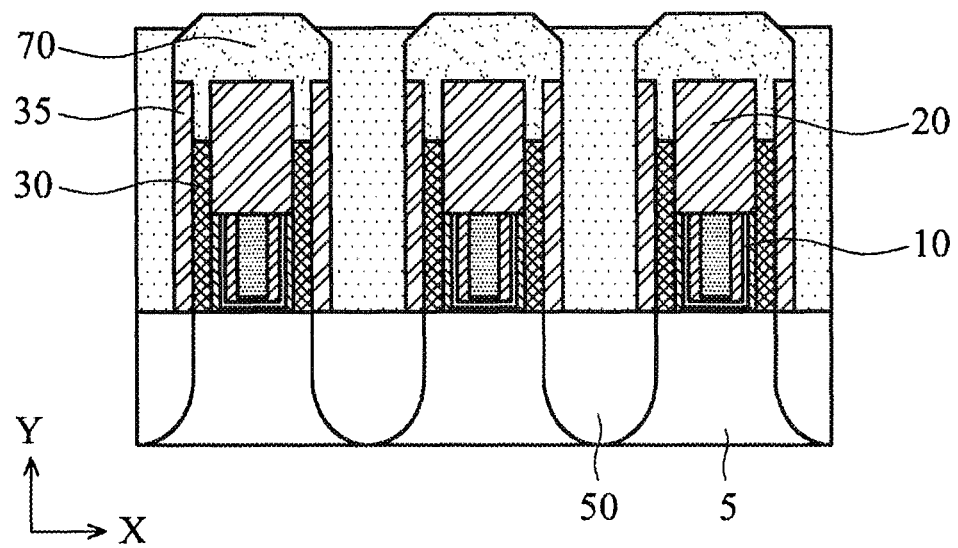

After the contact hole 85 is formed, a conductive material 90 is formed over the structure of FIG. 6. As shown in FIG. 7, one or more layers of conductive material 90, such as tungsten, titanium, cobalt, tantalum, copper, aluminum or nickel, or silicide thereof, or other suitable materials, are formed over the structure of FIG. 6. Then, a planarization operation, such as a CMP process, is performed, so as to obtain the structure of FIG. 8. The space between two gate structures is filled by the conductive material, thereby forming a source/drain contact 95 in contact with the source/drain region 50.

Figure 9:
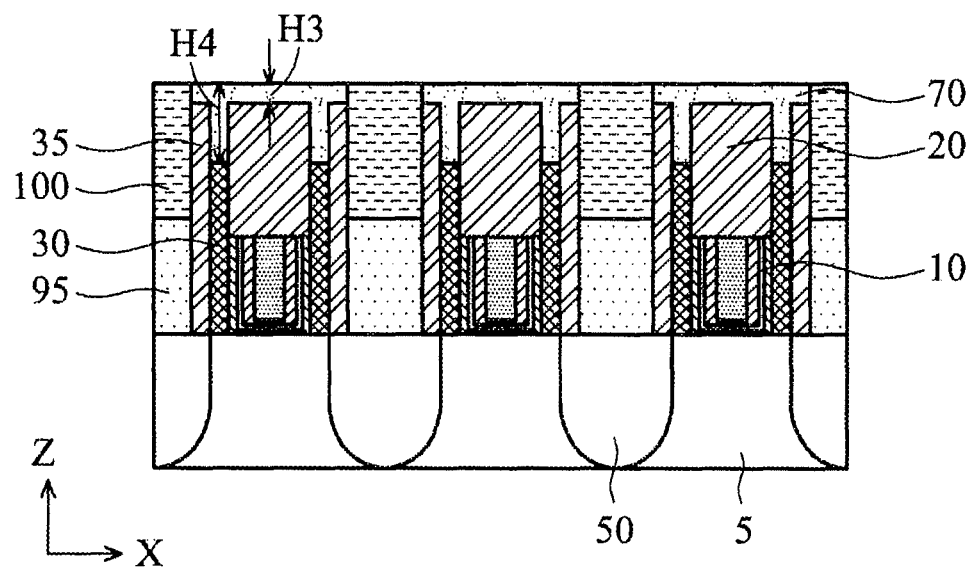

In this embodiment, the protective layer 70 is not removed and remains as shown in FIG. 9. In such a case, the protective layer 70 can function as a polishing stop layer in the CMP process. The source/drain contact 95 is in contact with the source/drain region 50. In some embodiments, the protective layer 70 is further removed during the CMP process or by the subsequent CMP process for the S/D cap insulating layer.

After the source/drain contact 95 is formed, the upper portion of the source/drain contact 95 is removed (recessed) and an S/D cap insulating layer 100 is formed as shown in FIG. 9. A blanket layer of an insulating material, such as SiC or SiOC, is formed and a CMP operation is performed. In FIG. 9, the thickness H3 of the head portion of the π-shape of the protective layer 70 is in a range from about 1 nm to about 5 nm in some embodiments. Further, the thickness H4 (length) of the leg portion of the π-shape of the protective layer 70 is greater than the thickness H3 of the head portion. The ratio of H4 to H3 (H4/H3) is in a range from about 1 to about 10 in some embodiments, and in a range from about 2 to about 6 in other embodiments.

Figure 10:
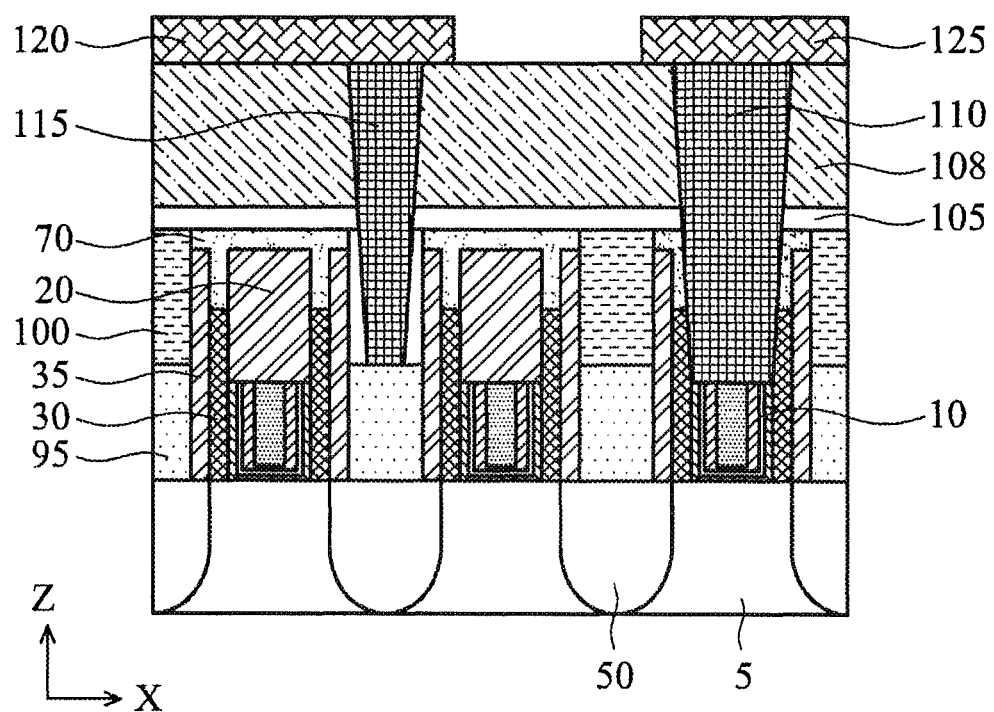

An etching-stop layer (ESL) 105 and a third ILD layer 108 are subsequently formed over the structure of FIG. 9. Then, a patterning operation is performed to form via holes. The via holes are filed with one or more conductive materials so as to form via plugs 110, 115, and a first metal wiring 120 and a second metal wiring 125 are formed over the via plugs 110 and 115, respectively, as shown in FIG. 10. The first and second metal wirings and the via plugs can be formed by a dual damascene method. In some embodiments, the ESL 105 is not formed.

It is understood that the device shown in FIG. 10 undergoes further CMOS processes to form various features such as interconnect metal layers, dielectric layers, passivation layers, etc.

The various embodiments or examples described herein offer several advantages over the existing art. For example, in the present disclosure, since a protective layer 70 is formed over the metal gate, the sidewall spacers and the cap insulating layer, it is possible to prevent the cap insulating layer from being etched during a contact hole etching, thereby preventing a short circuit between the metal gate and the source/drain contact.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a first gate structure is formed over a substrate. The first gate structure includes a first gate electrode, a first cap insulating layer disposed over the first gate electrode, first sidewall spacers disposed on opposing side faces of the first gate electrode and the first cap insulating layer and second sidewall spacers disposed on the first sidewall spacers. The first gate structure extends along a first direction. A first source/drain region is formed. A first insulating layer is formed over the first source/drain region. After the forming the first insulating layer, the first cap insulating layer and the second sidewall spacers are recessed, and the first sidewall spacers are recessed, thereby forming a first recessed space. A first protective layer is formed in the first recessed space. The first recessed space has a π-shape having a head portion above the first cap insulating layer and the second sidewall spacers and two leg portions above the first sidewall spacers in a cross section along a second direction perpendicular to the first direction. The first protective layer has π-shape having a head portion and two leg portions in a cross section along the second direction.

According to another aspect of the present disclosure, in a method of manufacturing a semiconductor device, a first gate structure and a second gate structure are formed over a substrate. The first gate structure includes a first gate electrode, a first cap insulating layer disposed over the first gate electrode, first sidewall spacers disposed on opposing side faces of the first gate electrode and the first cap insulating layer and first etch-stop layers disposed on the first sidewall spacers. The second gate structure includes a second gate electrode, a second cap insulating layer disposed over the second gate electrode, second sidewall spacers disposed on opposing side faces of the second gate electrode and the second cap insulating layer and second etch-stop layers disposed on the first sidewall spacers. The first and second gate structures extend along a first direction. A first source/drain region is formed in an area between the first gate structure and the second gate structure. A first insulating layer is formed over the first source/drain region and between the first gate structure and the second gate structure. After the forming the first insulating layer, the first and second cap insulating layers and the first and second etch-stop layers are recessed, and the first and second sidewall spacers are recessed, thereby forming a first recessed space above the first gate electrode and a second recessed space above the second gate electrode. A first protective layer is formed in the first recessed space and a second protective layer is formed in the second recessed space. Each of the first and second recessed spaces has a π-shape having a head portion and two leg portions in a cross section along a second direction perpendicular to the first direction. Each of the first and second protective layers has a π-shape having a head portion and two leg portions in a cross section along the second direction.

In accordance with yet another aspect of the present disclosure, a semiconductor device includes a first gate structure disposed on a substrate and extending in a first direction. The first gate structure includes a first gate electrode, a first cap insulating layer disposed over the first gate electrode, first sidewall spacers disposed on opposing side faces of the first gate electrode and the first cap insulating layer and second sidewall spacers disposed over the first sidewall spacers. The semiconductor device further includes a first protective layer formed over the first cap insulating layer, the first sidewall spacers and the second sidewall spacers. The first protective layer has a π-shape having a head portion and two leg portions in a cross section along a second direction perpendicular to the first direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first gate structure including a first gate electrode, a first cap insulating layer disposed over the first gate electrode, first sidewall spacers disposed on opposing side faces of the first gate electrode and on opposing side faces of the first cap insulating layer, and second sidewall spacers disposed on the first sidewall spacers, the first gate structure extending in a first direction; and
   a first protective layer formed over the first cap insulating layer, the first sidewall spacers, and the second sidewall spacers,
   wherein the first protective layer has a π-shape having a head portion and two leg portions in a cross section along a second direction perpendicular to the first direction.

2. The semiconductor device of claim 1, wherein bottoms of the leg portions are in contact with upper surfaces of the first sidewall spacers.

3. The semiconductor device of claim 1, wherein the first cap insulating layer is made of a same material as the second sidewall spacers and is made of a different material than the first sidewall spacers.

4. The semiconductor device of claim 3, wherein the first cap insulating layer and the second sidewall spacers are made of a silicon nitride based material.

5. The semiconductor device of claim 4, wherein the first sidewall spacers are made of a silicon oxide based material.

6. The semiconductor device of claim 1, wherein:
   the first cap insulating layer and the second sidewall spacers are made of SiN, and the first sidewall spacers are made of at least one of SiOC and SiOCN.

7. The semiconductor device of claim 6, wherein the first protective layer is made of at least one of aluminum nitride, aluminum oxynitride, aluminum oxide, titanium oxide, and zirconium oxide.

8. A semiconductor device comprising:
   a first gate structure and a second gate structure, each including a gate electrode, a cap insulating layer disposed over the gate electrode, first sidewall spacers disposed on opposing side faces of the gate electrode and on opposing side faces of the cap insulating layer, and second sidewall spacers disposed on the first sidewall spacers, the first and second gate structures extending in a first direction;
   a source/drain epitaxial layer disposed between the first and second gate structures;
   a first protective layer formed over each of the cap insulating layers, the first sidewall spacers, and the second sidewall spacers for each of the first and second gate structures;
   a source/drain contact contacting the source/drain epitaxial layer; and a source/drain cap layer disposed on the source/drain contact, wherein the first protective layer has a π-shape having a head portion and two leg portions in a cross section along a second direction perpendicular to the first direction.

9. The semiconductor device of claim 8, wherein bottoms of the leg portions are in contact with upper surfaces of the first sidewall spacers.

10. The semiconductor device of claim 8, wherein the interface between each of the bottoms of the leg portions and each of the upper surfaces of the first sidewall spacers is located above an upper surface of the source/drain contact.

11. The semiconductor device of claim 8, wherein the cap insulating layer is made of a same material as the second sidewall spacers and is made of a different material than the first sidewall spacers.

12. The semiconductor device of claim 11, wherein: the cap insulating layer and the second sidewall spacers are made of SiN, and the first sidewall spacers are made of at least one of SiOC and SiOCN.

13. The semiconductor device of claim 8, wherein the first protective layer is made of at least one of aluminum nitride, aluminum oxynitride, aluminum oxide, titanium oxide, and zirconium oxide.

14. A semiconductor device comprising:
a first gate structure including a first gate electrode, a first cap insulating layer disposed over the first gate electrode, first sidewall spacers disposed on opposing side faces of the first gate electrode and on opposing side faces of the first cap insulating layer, and second sidewall spacers disposed on the first sidewall spacers, the first gate structure extending in a first direction;
a second gate structure including a second gate electrode, third sidewall spacers disposed on opposing side faces of the second gate electrode and fourth sidewall spacers disposed on the third sidewall spacers, the second gate structure extending in the first direction; and
a first protective layer formed over the first cap insulating layer, the first sidewall spacers and the second sidewall spacers;
a second protective layer formed over the second gate electrode, the third sidewall spacers, and the fourth sidewall spacers; and
a gate contact contacting the second gate electrode passing through the second protective layer; and
wherein the first protective layer has a It-shape having a head portion and two leg portions in a cross section along a second direction perpendicular to the first direction.

15. The semiconductor device of claim 14, wherein bottoms of the leg portions are in contact with upper surfaces of the first sidewall spacers.

16. The semiconductor device of claim 14, wherein the first cap insulating layer is made of a same material as the second sidewall spacers and is made of a different material than the first sidewall spacers.

17. The semiconductor device of claim 16, wherein the first cap insulating layer and the second sidewall spacers are made of a silicon nitride based material.

18. The semiconductor device of claim 17, wherein the first sidewall spacers are made of a silicon oxide based material.

19. The semiconductor device of claim 14, wherein: the first cap insulating layer and the second sidewall spacers are made of SiN, and the first sidewall spacers are made of at least one of SiOC and SiOCN.

20. The semiconductor device of claim 19, wherein the first protective layer is made of at least one of aluminum nitride, aluminum oxynitride, aluminum oxide, titanium oxide, and zirconium oxide.

* * * * *